(12) United States Patent
Lee

(10) Patent No.: US 12,051,475 B2
(45) Date of Patent: Jul. 30, 2024

(54) MEMORY-READ VERIFICATION

(71) Applicant: NXP B.V., Eindhoven (NL)

(72) Inventor: Hyungjoong Lee, San Diego, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/721,005

(22) Filed: Apr. 14, 2022

(65) Prior Publication Data

US 2023/0335210 A1 Oct. 19, 2023

(51) Int. Cl.
| | | |
|---|---|---|
| G11C 29/42 | (2006.01) | |
| G11C 16/20 | (2006.01) | |
| G11C 16/34 | (2006.01) | |
| G11C 29/12 | (2006.01) | |
| G11C 29/20 | (2006.01) | |

(52) U.S. Cl.
CPC ............ *G11C 29/42* (2013.01); *G11C 16/20* (2013.01); *G11C 16/3459* (2013.01); *G11C 29/1201* (2013.01); *G11C 29/20* (2013.01)

(58) Field of Classification Search
None
See application file for complete search history.

(56) References Cited

U.S. PATENT DOCUMENTS

| | | | | |
|---|---|---|---|---|
| 6,560,740 B1 * | 5/2003 | Zuraski, Jr. | ........ | G01R 31/3187 714/733 |
| 7,266,028 B1 * | 9/2007 | Ghosh Dastidar | ..... | G11C 29/44 365/201 |
| 7,584,350 B2 | 9/2009 | Kuhls et al. | | |
| 2001/0052090 A1 * | 12/2001 | Mio | ........ | G11C 29/42 |
| 2008/0082899 A1 | 4/2008 | Muhammad et al. | | |
| 2014/0226426 A1 * | 8/2014 | Uvieghara | ............ | G11C 5/143 365/226 |
| 2016/0155515 A1 * | 6/2016 | Son | ..................... | G11C 11/1673 714/719 |
| 2019/0088349 A1 * | 3/2019 | Pyo | ........ | G11C 29/46 |

OTHER PUBLICATIONS

Wang, Jiajing et al. "Canary Replica Feedback for Near-DRV Standby VDD Scaling in a 90nm SRAM", IEEE 2007 Custom Intergrated Circuits Conference (CICC), (2007), pp. 29-32.
Wang, J iajing et al.; "An Enhanced Adaptive Canary System for SRAM Standby Power Reduction"; 4 pages; 2008.

* cited by examiner

*Primary Examiner* — J. H. Hur

(57) ABSTRACT

A system for verifying memory-read capabilities includes a memory device, having a memory cell array that is encoded with verification information, and a memory-read controller, coupled to the memory device and configured to execute stored process steps. The verification information includes first bit values encoded in a first row of the memory cell array and second bit values encoded in a second row of the memory cell array. Each of the second bit values on a same bit line as a corresponding one of the first bit values has an inverse value as the corresponding one of the first bit values. The stored process steps include steps to: read the verification information from the memory device; determine, by comparison to a pre-stored bit string, whether the first bit values and the second bit values are correct; and in response to an affirmative determination, initiate normal data-read operations.

20 Claims, 6 Drawing Sheets

MEMORY-READ VERIFICATION

FIELD OF THE INVENTION

The present invention pertains, among other things, to systems, methods and techniques for verifying reliable data reading from memory after boot-up, e.g., so that normal, reliable data-read operations can begin.

BACKGROUND

The following discussion concerns some of the prior art that is relevant to the present invention, and provides the present inventor's observations regarding, and/or characterizations of, such prior art, e.g., including analysis of some of the problems and shortcomings associated with such prior art that have been identified by the present inventor. Only knowledge explicitly described in the following discussion as being "conventional" or "prior art" is intended to be characterized as such.

When powering up a computer memory and/or memory-read controller, it typically is desirable to identify when the system has stabilized sufficiently (e.g., the supply voltage is high enough) to allow reliable data reading. Although hardware manufacturers often provide code (proprietary to the manufacturer) for making this determination, the present inventor has determined that such code often is unnecessarily large (e.g., requiring excessive chip area for storage), and its execution frequently takes too long to identify the point at which reliable read operations can occur, resulting in excessive delay between power-up and the start of normal data-read operations. This latter disadvantage, in particular, often makes it more difficult to meet system requirements, and it is an even bigger factor when hardware is desired to be operated in a power-saving mode, in which components frequently are powered down when not needed and then powered up again only when necessary to read data.

SUMMARY

One embodiment of the invention is directed to a system for verifying memory-read capabilities that includes a memory device, having a memory cell array that is encoded with verification information, and a memory-read controller, coupled to the memory device and configured to execute stored process steps. The verification information includes first bit values encoded in a first row of the memory cell array and second bit values encoded in a second row of the memory cell array. Each of the second bit values on a same bit line as a corresponding one of the first bit values has an inverse value as the corresponding one of the first bit values. The stored process steps include steps to: read the verification information from the memory device and determine, by comparison to a pre-stored bit string, whether the first bit values and the second bit values are correct.

In certain more specific embodiments: (1) the memory-read controller automatically begins executing the stored process steps upon power up; (2) the first row and the second row of the memory cell array are immediately adjacent to each other; (3) there are at least six of the second bit values and at least six of the corresponding ones of the first bit values; (4) there are at least eight of the second bit values and at least eight of the corresponding ones of the first bit values; (5) the verification information also includes an error correction code (ECC), and the process steps include a step of checking the verification information read in step (a) for an un-correctable ECC error; (6) step (b) is performed only if it is determined that there is no such un-correctable ECC error; (7) each cell in the memory cell array representing one of the first bit values or one of the second bit values, referred to as a subject bit value, is encoded using differential-redundant encoding across 4 one-bit subcells, with 2 of such one-bit subcells encoded with the subject bit value and with 2 of such one-bit subcells encoded with the inverse of the subject bit value; (8) the memory device is a one-time programmable memory device; (9) the stored process steps also include a step (c) in response to an affirmative determination in step (b), to initiate normal data-read operations; (10) the stored process steps also include a step to repeat steps (a) and (b), and normal data-read operations begin in step (c) only if an affirmative determination is made in step (b) a predetermined number of times, such predetermined number being at least 2 or at least 4; (11) the predetermined number of affirmative determinations must be consecutive for normal data-read operations to begin in step (c); (12) the stored process steps also include a step, executed between repetitions of said steps (a) and (b), to wait a specified period of time, the specified period of time being at least 50 or at least 80 microseconds ($\mu s$); (13) the verification information also includes an error correction code (ECC), the process steps include a step of checking the verification information read in step (a) for an un-correctable ECC error prior to each iteration of step (b), and the iteration of step (b) is performed only if it is determined that there is no said un-correctable ECC error; (14) in the event of either an un-correctable ECC error or a negative determination in step (b), a pass counter is reset and a try counter is incremented; (15) when the try counter exceeds a specified threshold, a fail indication is output; and/or (16) in response to the pass counter exceeding a specified threshold, normal data-read operations are initiated.

According to another representative embodiment, a system for verifying memory-read capabilities before initiating normal data-read operations includes: (a) means for reading verification information from a memory device, said memory device including a memory cell array that is encoded with verification information, and said verification information including a plurality of first bit values encoded in a first row of the memory cell array and a plurality of second bit values encoded in a second row of the memory cell array, with each of the second bit values on a same bit line as a corresponding one of the first bit values having an inverse value as the corresponding one of the first bit values; (b) means for determining, by comparison to a pre-stored bit string, whether the first bit values and the second bit values are correct; and (c) means for, in response to an affirmative determination by said means (b), initiating normal data-read operations.

According to a further representative embodiment, a tangible medium stores readable, executable process steps for verifying memory-read capabilities before initiating normal data-read operations, said process steps include steps to: (a) read verification information from a memory device, said memory device including a memory cell array that is encoded with verification information, and said verification information including a plurality of first bit values encoded in a first row of the memory cell array and a plurality of second bit values encoded in a second row of the memory cell array, with each of the second bit values on a same bit line as a corresponding one of the first bit values having an inverse value as the corresponding one of the first bit values; (b) determine, by comparison to a pre-stored bit string, whether the first bit values and the second bit values are correct; and (c) in response to an affirmative determination in step (b), initiate normal data-read operations.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the accompanying drawings. However, it should be understood that the drawings merely depict certain representative and/or exemplary embodiments and features of the present invention and are not intended to limit the scope of the invention in any manner. The following is a brief description of each of the accompanying drawings.

DETAILED DESCRIPTION

The present invention addresses the problems describe in the Background section above by, among other things, utilizing a unique arrangement of keywords stored in a memory device and/or a methodology for repeatedly reading such keywords, e.g., in a manner that is configurable and can provide a good trade-off between level of certainty that the system is ready for normal data-read operations with respect to the memory device the amount of time required to make that determination.

Figure 1:
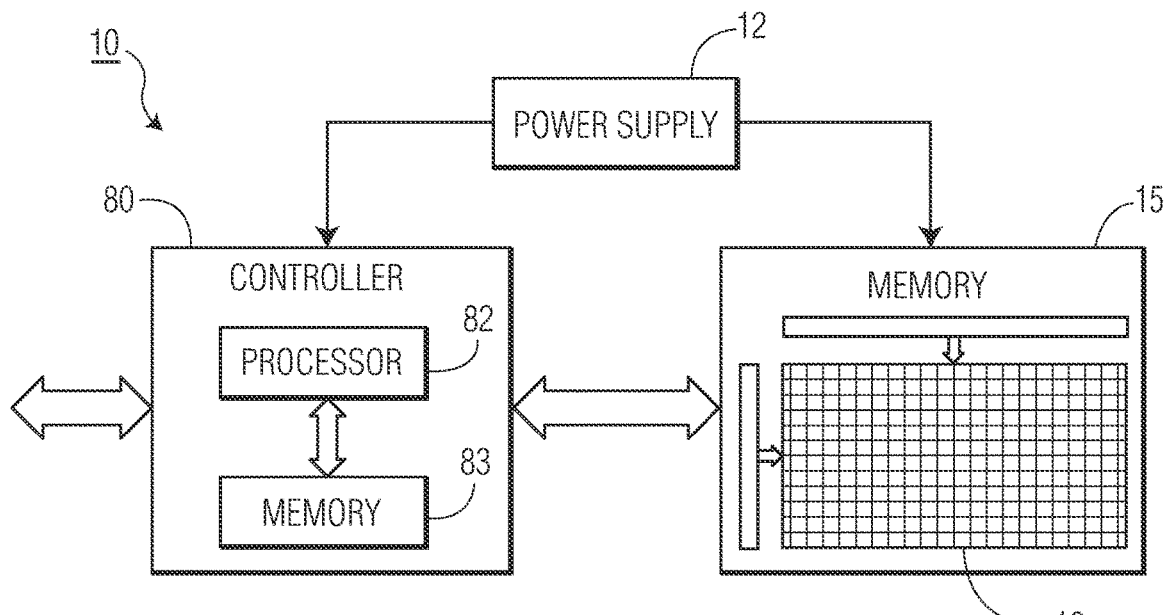
FIG. 1 is a simplified block diagram of a conventional memory-read system within which the present invention may be implemented.

FIG. 1 is a simplified block diagram of a conventional memory-read system 10 within which the present invention may be implemented. As shown, system 10 includes a power supply 12, a memory device 15, and a memory-read controller 80. In operation, controller 80 uses a processor 82, executing instructions stored in memory 83, to read and output (e.g., to a central processor, not shown in the drawings) information stored in memory device 15. In the current embodiment, memory device 15 is a Synopsys™ SLPMX OTP (One-Time Programmable) NVM (Non-Volatile Memory), controller 80 is a Synopsys™ SLPMX OTP NVM controller, operating in its Differential-Redundant read mode, and power supply 12, which powers both memory device 15 and controller 80, is a digital isolated power supply (IPS). However, use of other types of memory device(s), controller(s), memory-read mode(s), and/or power-supply architecture(s), as well as any combinations of the foregoing, also should be considered to be within the scope of the present invention. Also, although shown as separate components, in alternate embodiments, any or all of power supply 12, memory device 15 and/or controller 80 may be partially or wholly integrated into a single component and/or integrated with other components (e.g., components not shown in the drawings), as will be readily understood by those of ordinary skill in the art.

Figure 2:
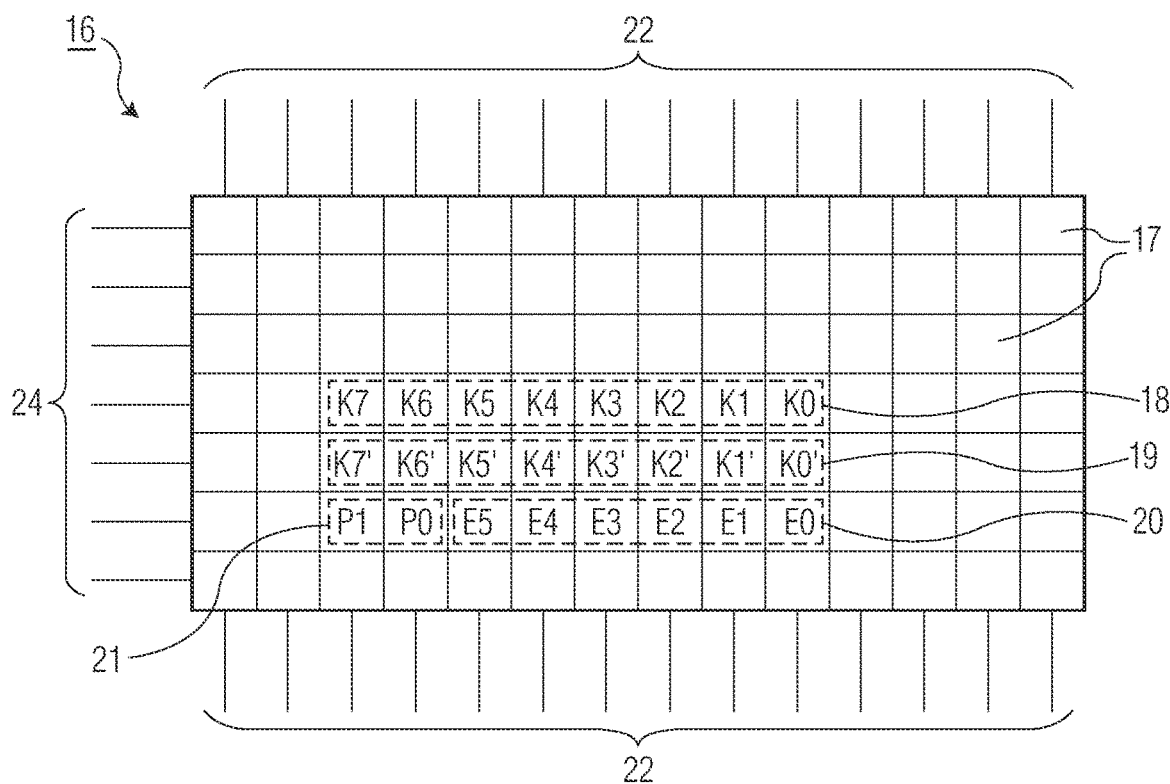
FIG. 2 is a conceptual view of a portion of the memory-cell array within a memory device, such as the memory device shown in FIG. 1, encoded with verification information, in accordance with a representative embodiment of the present invention.

In the current embodiment, the core of memory device 15 is a memory-cell array 16. More specifically, as more clearly shown in FIG. 2, memory-cell array 16 is configured in this embodiment as a two-dimensional array of individual memory cells 17, each capable of storing a single bit of data.

One feature of the present invention is the use of a small portion of memory-cell array 16, referred to herein as the boot sector of the memory device 15, to store memory-read verification information. In the preferred embodiments of the present invention, such memory-read verification information includes a pair of keywords 18 and 19 and an error-correction code (ECC) 20. Even more preferably: (1) keywords 18 and 19 are aligned with each other, occupying the same bit positions within different rows of memory-cell array 16; (2) at each such bit position, the value of the bit in keyword 19 is the inverse (i.e., the ones complement) of the value at the same bit position (i.e., on the same bit line) in keyword 18; and (3) keywords 18 and 19 are in rows that are immediately adjacent to each other. For example, in the specific embodiment shown in FIG. 2, each of keywords 18 and 19 includes eight bits, keyword 18 is 8h'S5 (01011010) and keyword 19 is 8h'A5 (10100101).

The present inventor has discovered that the use of such an alignment of inverse bit values can greatly improve the reliability of a data-read verification process (such as process 100 discussed below) because, e.g., particularly when using certain types of memory devices (such as those discussed below), the values read by a controller 80, prior to the time that the supplied power reaches an appropriate value for reliable read operations, typically will be highly correlated along bit lines, and especially with respect to immediately adjacent bit positions (e.g., the same bit positions on immediately adjacent rows of memory-cell array 16).

In the current embodiment, ECC 20 is a 6-bit value that is used for cyclic redundancy checking (CRC), so that single-bit errors can be corrected and multi-bit errors flagged. The other 2 bits in the byte containing ECC 20 are used as address parity bits 21 in the present embodiment.

For ease of implementing the verification process 100 (discussed in greater detail below), it sometimes will be desirable to include the verification information at the beginning of the memory-cell array 16. However, other than the preferred keyword alignment noted above, the positions of such information within memory-cell array 16 typically will not have a significant impact. Thus, for example, although all of the bits of keywords 18 and 19 are illustrated as being a continuous sequence, which again, typically will be preferable for ease of implementation, in alternate embodiments, such bits need not be, although even in these alternate embodiments, the corresponding bits of keywords 18 and 19 preferably have inverse-aligned values, as discussed above. Also, although in the current embodiment ECC 20 is stored close to keywords 18 and 19 (again, for ease of implementation), in alternate embodiments it is stored in other locations.

In the embodiment discussed above, each of the keywords 18 and 19 includes eight bits, which currently is preferred. In alternate embodiments, different numbers of bits are used, such as 16 or 32. Preferably, depending upon the embodiment, each of the keywords 18 and 19 includes at least 6, 8 or 16 bits. Currently, it is not believed that much additional benefit is achieved using keyword lengths greater than 32 bits, at least not enough to offset the additional costs. As noted above, in the current embodiment, the ECC is 6 bits. However, in other embodiments, other ECC links are used, e.g., depending upon the number of bits in keywords 18 and 19.

Figure 3:
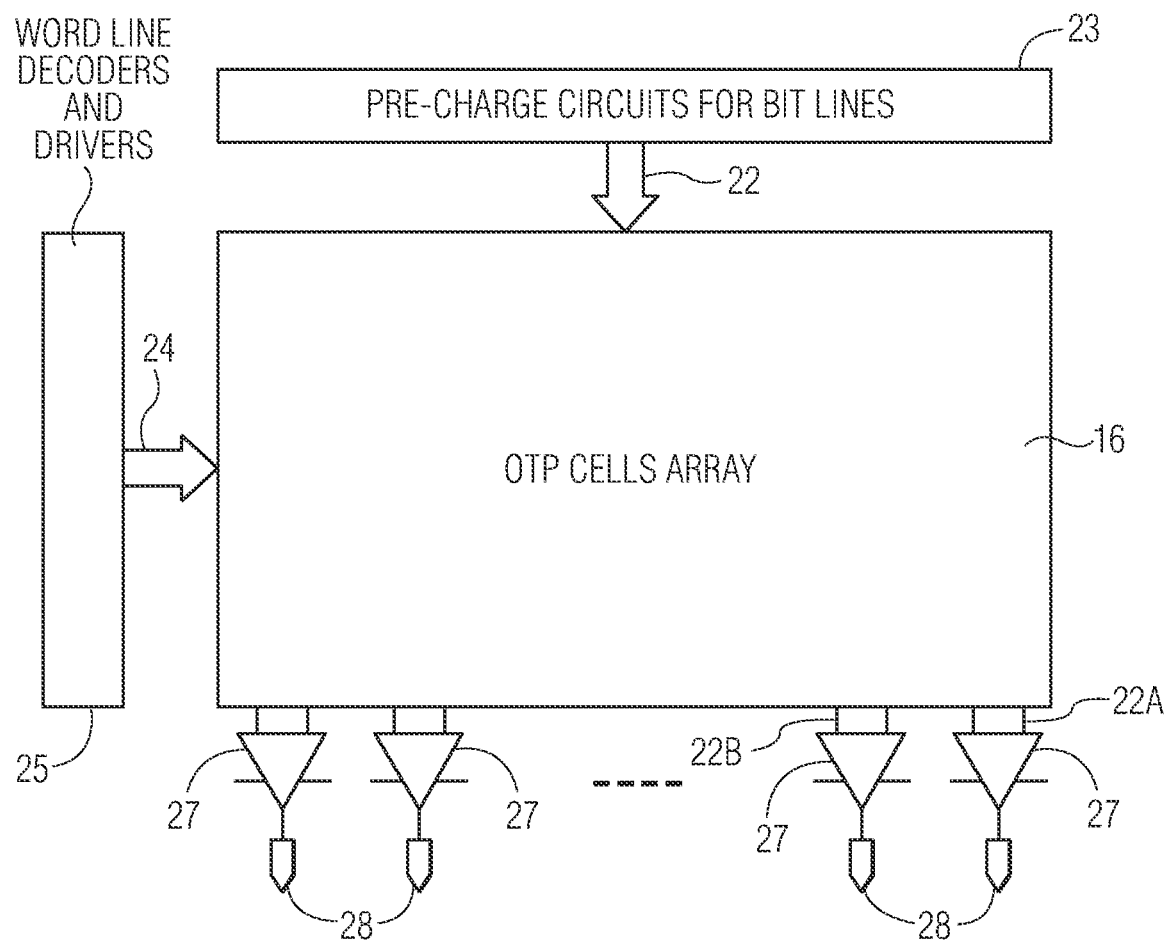
FIG. 3 is a simplified block diagram of the memory device shown in FIG. 1.

As shown more clearly in FIG. 3, bit lines 22 connect memory-cell array 16 to pre-charging circuitry 23 and to analog output comparators 27, and word-selection lines 24 connect memory-cell array 16 to word line decoders and drivers 25. More specifically, with the specific architecture of the current embodiment, the bit line 22 for each memory cell 17 within memory-cell array 16 includes two differential lines 22A&B, connected to a comparator 27, which in turn has an output 28 that provides a signal indicating the value of such memory cell 17 (when its row/word has been selected by a corresponding word-selection line 24).

Figure 4:
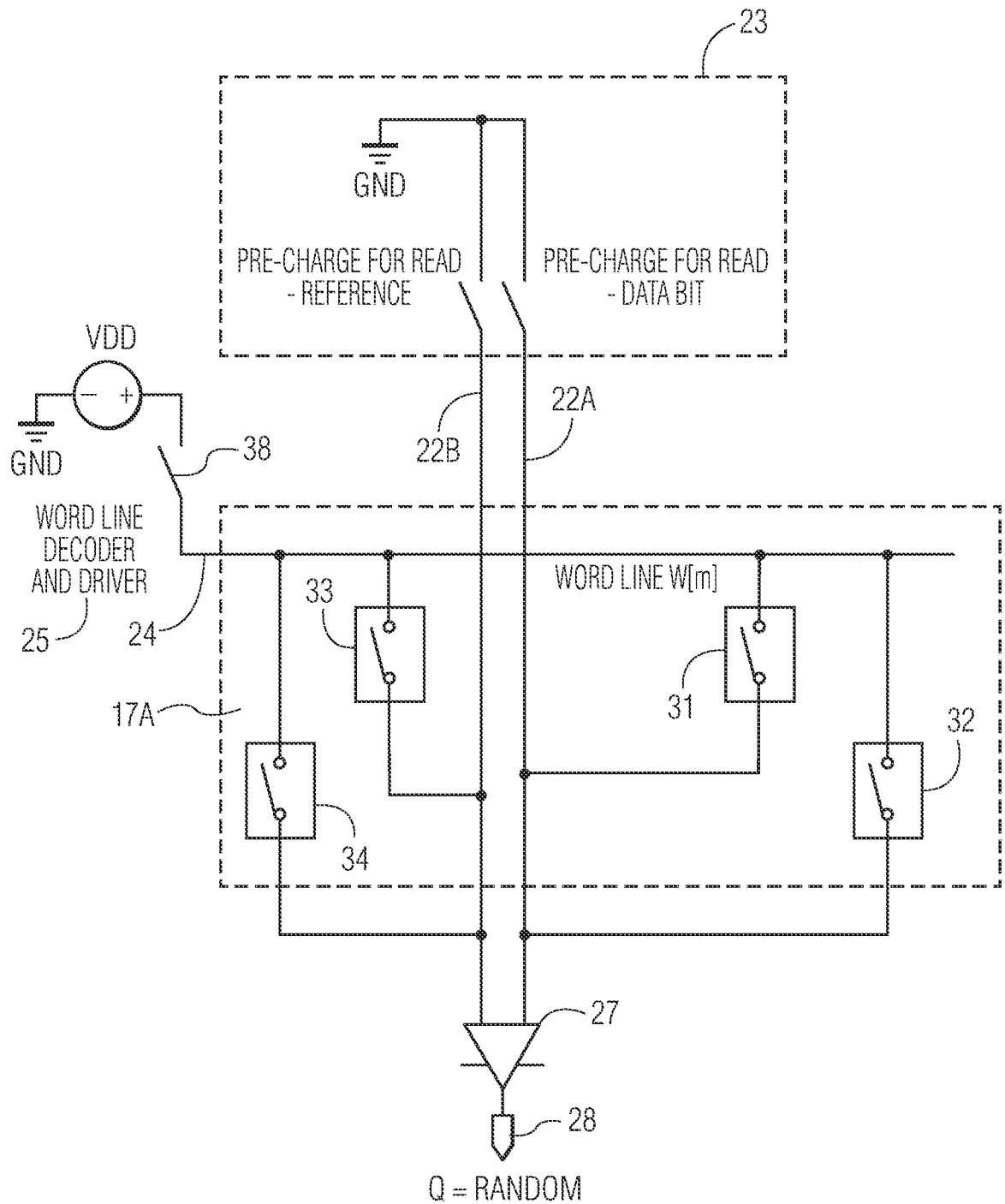
FIG. 4 is a schematic diagram showing a single unprogrammed conventional one-time programmable (OTP) memory cell, together with circuitry for reading the cell's value.
Figure 5:
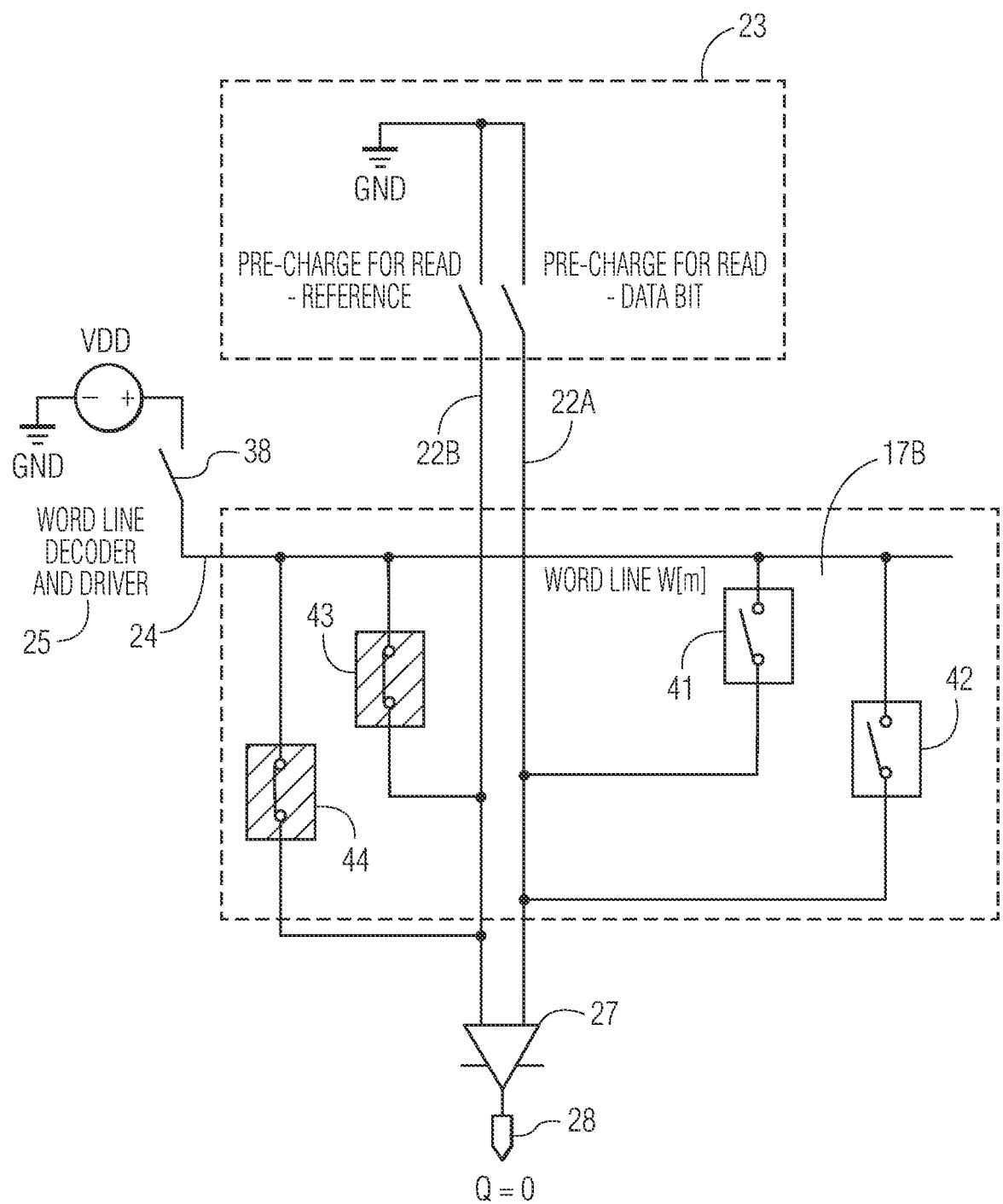
FIG. 5 is a schematic diagram showing a single conventional OTP memory cell that has been programmed with the bit value 0, together with circuitry for reading the cell's value.
Figure 6:
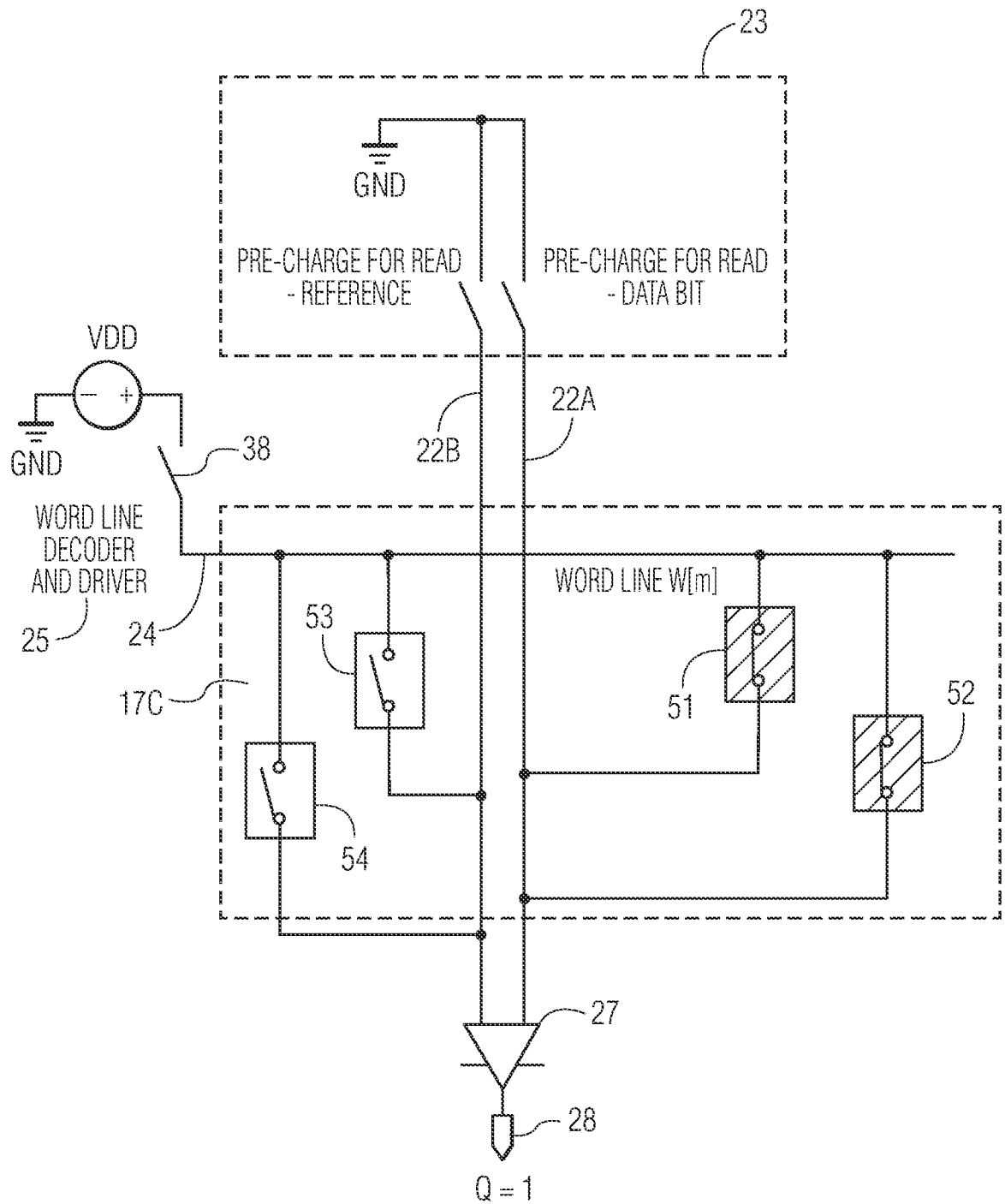
FIG. 6 is a schematic diagram showing a single conventional OTP memory cell that has been programmed with the bit value 1, together with circuitry for reading the cell's value.

Each of FIGS. 4-6 illustrates the reading of a single memory cell 17 according to the current embodiment of the present invention. In this embodiment, each such memory cell 17 is comprised of four separate floating-gate subcells that are (or can be) differential-redundant encoded with the cell 17's intended value. For example, FIG. 4 shows an unprogrammed memory cell 17A, including its four unprogrammed subcells 31-34. As shown, each of subcells 31-34 can be viewed as a simple switch, in the open position by default. The adopted convention is that this open (unprogrammed) state is equivalent to binary value 0. In order to "program" a given subcell, power is applied during the burn process in order to break down a thin oxide layer, thereby closing the switch. For this reason, each subcell can only be programmed one time, but once programmed, its value is non-volatile. Also, it is noted that this architecture occupies very little chip area, requires low voltage (e.g., 1.5V±10%) and low power for reading, and provides very stable performance at high temperatures, so it is preferred for many applications.

When memory cell 17A eventually is programmed, subcells 31 and 32 are set to cell 17A's desired value, and subcells 33 and 34 are set to the inverse of cell 17A's value, as discussed in greater detail below. Prior to reading memory cell 17A, pre-charging circuitry 23 clears the cell 17A's bit line 22 (which, again, includes two differential lines 22A&B). If the word that includes memory cell 17A has been selected, then switch 38 is closed, so power is applied to word line 24. However, because memory cell 17A has not been programmed, all of its subcells 31-34 are in a high-impedance state, so the output of comparator 27 (which is decided, e.g., by input offset, leakage current in the bit lines 22, and other parasitic factors) is random.

At the same time, the present inventor has discovered that, when looking at different comparators 27 on the same bit line 22, the seemingly random values read from individual unprogrammed memory cells 17 are not in fact truly random, but rather the outputs 28 of comparators 27 that are on the same bit line 22 tend to show similar values. Moreover, the present inventor has discovered that this correlation is even stronger if such memory cells 17 on the same bit line 22 are also in immediately adjacent rows of the memory-cell array 16. In other words, unprogrammed individual memory cells 17 will be read to have essentially random values, but those values will be correlated when read across the same physical bit line 22 (again, especially if reading immediately adjacent memory cells 17 on the same bit line 22).

FIG. 5 shows a memory cell 17B that has been programmed with the bit value 0, by appropriately encoding its four subcells 41-44. Specifically, during the burn process, subcells 41 and 42 have been left in their unprogrammed (high-impedance) state (corresponding to a bit value of 0), and subcells 43 and 44 were programmed (allowing them to conduct, thereby corresponding to a bit value of 1). The differential-redundant nature of the programming of a memory cell 17 is now apparent with reference to programmed memory cell 17B. Specifically, on each side of comparator 27, two subcells are configured identically (programmed or left unprogrammed, as the case may be) and are connected in parallel with each other. This parallel configuration provides the redundancy, because if either such subcell is programmed, the entire side will conduct. At the same time, only one side is programmed (in this case, because the memory cell 17B has been programmed with the bit value 0, only the left side, or the side corresponding to differential line 22B) and the other side is left unprogrammed, thereby providing the differential aspect. In this state, with power applied to word-selection line 24, the output 28 of comparator 27 indicates that the value of memory cell 17B is 0.

FIG. 6 shows a memory cell 17C that has been programmed with the bit value 1, by appropriately encoding its four subcells 51-54. Specifically, during the burn process, subcells 51 and 52 were programmed (allowing them to conduct, thereby corresponding to a bit value of 1), and subcells 53 and 54 have been left in their unprogrammed (high-impedance) state (corresponding to a bit value of 0). In this state, with power applied to word-selection line 24, the output 28 of comparator 27 indicates that the value of memory cell 17C is 1.

As indicated above, in certain circumstances, such as the configuration described above, individual unprogrammed memory cells 17 typically are read as random values. This situation makes it difficult to determine when the supplied power is high enough and other conditions are adequate to reliably read data from a desired memory device. One aspect of certain solutions according to the present invention is the use of bit-line-aligned inverse (ones complement) keywords (preferably in immediately adjacent rows of a memory array), as described above. Then, as a result of the bit-line correlation, if both words are read correctly (e.g., by comparing the values that have been read to reference value(s) within memory 83), it is much less likely that the match is the result of random chance.

Figure 7:
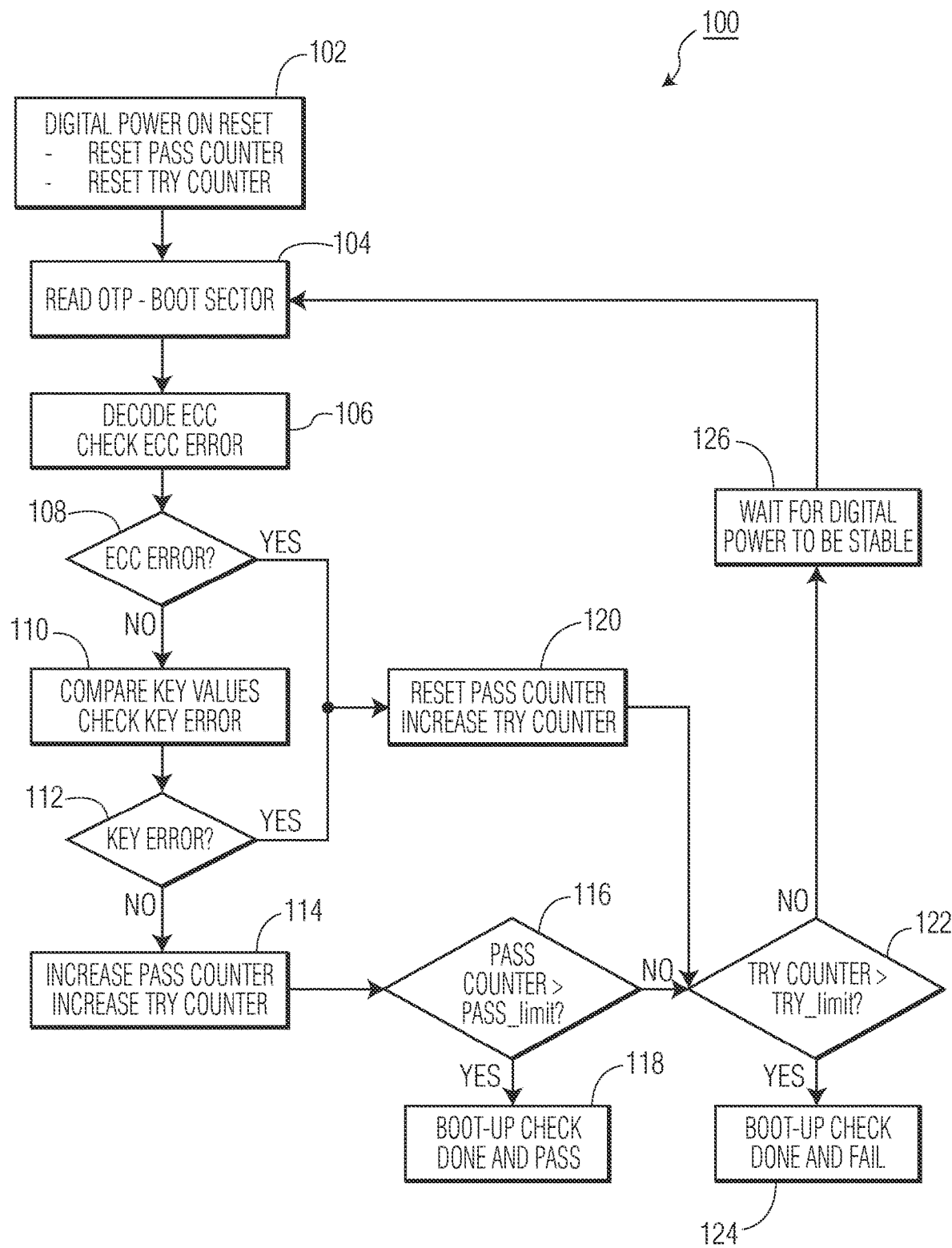
FIG. 7 is a flow diagram illustrating a boot-up process for verifying memory-read capabilities and then, in response, initiating normal data-read operations, according to a representative embodiment of the present invention.

FIG. 7 is a flow diagram illustrating a boot-up process 100 that can be used in combination with the foregoing configuration, according to a representative embodiment of the present invention. In the preferred embodiments, controller 80 is configured to automatically perform process 100 upon power up.

Initially, in step 102 a "pass" counter register and a "try" counter reset register, both stored, e.g., in the controller's memory 83, are reset to 0.

Next, in step 104 the boot sector of memory device 15 is read, thereby inputting values for the two keywords 18 and 19, as well as the ECC 20.

In step 106, the information read in step 104 is processed to determine whether there is an un-correctable ECC error (in the present embodiment, a multi-bit ECC error). If so, then in step 108, processing proceeds to step 120. If not, then in step 108, processing proceeds to step 110.

In step 110, a determination is made as to whether the two keywords 18 and 19 have been read correctly, e.g., by comparison to one or more values that have been pre-stored into the controller's memory 83. Because keywords 18 and 19 preferably are ones complements of each other, it typically is sufficient to store just one reference value in memory 83. However, in certain cases, execution of this step 110 may be faster if both of keywords 18 and 19 are stored in memory 83. In any event, if the two keywords 18 and 19 have in fact been read correctly (i.e., no error), then in step 112 processing proceeds to step 114. If not (i.e., any keyword reading error is detected), then in step 112 processing proceeds to step 120 (discussed below).

In step 114, each of the pass counter and the try counter is incremented by 1, and then processing proceeds to step 116.

In step 116, a determination is made as to whether the pass counter register value exceeds a specified (e.g., pre-stored, fixed) threshold, referred to as the pass_limit. Preferably, the pass_limit is at least 2 or at least 4. In the current embodiment, the pass_limit is set to 4. If the pass counter register value in fact exceeds the pass_limit, then processing proceeds to step 118. If not, processing proceeds to step 122 (discussed below).

In step 118, an indication is set that proper and reliable memory reading is occurring, and therefore, normal data-read operations are initiated by the controller 80.

In step 120, in response to the failure in step 108 or 112, the pass counter is reset, the try counter is incremented by 1, and processing proceeds to step 122. It is noted that in the current embodiment, in order to verify that memory reading is occurring properly and reliably, the two keywords 18 and 19 must be correctly read in a minimum number of consecutive read attempts, (that number being the pass_limit). For that reason, in the current embodiment, the pass counter is reset in the event of any failed read attempt. However, in alternate embodiments, other criteria instead are used to verify that memory reading is occurring properly and reliably.

In step 122, a determination is made as to whether the try counter register value exceeds a specified (e.g., pre-stored, fixed) threshold, referred to as the try_limit. Preferably, the try_limit is between 6-20. In the current embodiment, the try_limit is set to a value of between 10-16. If the try counter register value in fact exceeds the try_limit, then processing proceeds to step 124. If not, processing proceeds to step 126 (discussed below).

In step 124, the process 100 is deemed completed and a read-failure indication is output.

In step 126, processing is paused for a specified (e.g., pre-stored, fixed) period of time, referred to herein as the wait_time, and then processing returns to step 104 in order to again attempt to read the verification information in the boot sector of memory device 15. Preferably, the specified period of time is at least 50 or 80 microseconds ($\mu s$). In the current specific embodiment, it is set at 100 $\mu s$.

As indicated above, process 100 preferably operates in conjunction with the preferred memory structure in which a pair of bit-line-aligned ones-complement keywords 18 and 19 are stored in the memory device 15. As a result of this memory structure, each correct reading of keywords 18 and 19 has a relatively low probability of being the result of random chance. In addition, process 100 uses several variables (pass_limit, try_limit and wait_time) that can be pre-set (e.g., depending upon the particular application/ embodiment) or even adjusted on-the-fly (e.g., based on earlier results) to achieve desired trade-off between read-reliability and verification speed, with the preferred ranges of such values having been noted above.

The foregoing arrangements often can provide a safe boot-up check, while saving significant memory area and providing a robust yet quick boot-up time, in more particularized aspects of the foregoing arrangement, such a boot-up check can be optimized for different applications.

System Environment

Generally speaking, except where clearly indicated otherwise, all of the systems, methods, modules, components, functionality and techniques described herein can be practiced with the use of one or more programmable general-purpose computers and/or special-purpose controllers, processors or computers. Such devices (e.g., including any of the electronic devices mentioned herein) typically will include, for example, at least some of the following components coupled to each other, e.g., via a common bus: (1) one or more central processing units (CPUs); (2) read-only memory (ROM); (3) random access memory (RAM); (4) other integrated or attached storage devices; (5) input/output software and circuitry for interfacing with other devices (e.g., using a hardwired connection, such as a serial port, a parallel port, a USB connection or a FireWire connection, or using a wireless protocol, such as radio-frequency identification (RFID), any other near-field communication (NFC) protocol, Bluetooth or a 802.11 protocol); (6) software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; (7) a display (such as a liquid crystal display, an organic light-emitting display, a polymeric light-emitting display or any other thin-film display); (8) other output devices (such as one or more speakers, a headphone set, a laser or other light projector and/or a printer); (9) one or more input devices (such as a mouse, one or more physical switches or variable controls, a touch-pad, tablet, touch-sensitive display or other pointing device, a keyboard, a keypad, a microphone and/or a camera or scanner); (10) a mass storage unit (such as a hard disk drive, a solid-state drive, or any other type of internal storage device); (11) a real-time clock; and/or (12) a removable storage read/write device (such as a flash drive, a memory card, any other portable drive that utilizes semiconductor memory, a magnetic disk, a magnetic tape, an opto-magnetic disk, an optical disk, or the like); However, in some cases the process steps initially are stored in RAM or ROM and/or are directly executed out of mass storage.

In general, it should be noted that, except as expressly noted otherwise, any of the functionality described above can be implemented by a general-purpose or special-purpose processor executing software and/or firmware, by dedicated (e.g., logic-based) hardware, or any combination of these approaches, with the particular implementation being selected based on known engineering tradeoffs. More specifically, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality and/or for implementing the modules and components of this invention. Such media include, by way of example, magnetic disks, magnetic tape, optically readable media such as CDs and DVDs, or semiconductor memory such as various types of memory cards, USB flash memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

In addition, where the present disclosure refers to a processor, computer, server, server device, computer-readable medium or other storage device, client device, or any other kind of apparatus or device, such references should be understood as encompassing the use of plural such processors, computers, servers, server devices, computer-readable media or other storage devices, client devices, or any other such apparatuses or devices, except to the extent clearly indicated otherwise. For instance, a server generally can (and often will) be implemented using a single device or a cluster of server devices (either local or geographically dispersed), e.g., with appropriate load balancing. Similarly, a server device and a client device often will cooperate in executing the process steps of a complete method, e.g., with each such device having its own storage device(s) storing a portion of such process steps and its own processor(s) executing those process steps.

Additional Considerations

As used herein, the term "coupled", or any other form of the word, is intended to mean either directly connected or connected through one or more other components, elements or processing blocks, e.g., for the purpose of preprocessing. In the drawings and/or the discussions of them, where individual steps, components, modules or processing blocks are shown and/or discussed as being directly connected to each other, such connections should be understood as couplings, which may include additional steps, components, modules, elements and/or processing blocks. Unless otherwise expressly and specifically stated otherwise herein to the contrary, references to a signal herein mean any processed or unprocessed version of the signal. That is, specific processing steps discussed and/or claimed herein are not intended to be exclusive; rather, intermediate processing may be performed between any two processing steps expressly discussed or claimed herein, except to the extent expressly stated otherwise.

Whenever a specific value is mentioned herein, such a reference is intended to include that specific value or substantially or approximately that value. In this regard, the foregoing use of the word "substantially" is intended to encompass values that are not substantially different from the stated value, i.e., permitting deviations that would not have substantial impact within the identified context. For example, stating that a continuously variable signal level is set to a particular value should be understood to include values within a range around such specifically stated value that produce substantially the same effect as the specifically stated value. For example, the identification of a single length, width, depth, thickness, etc. should be understood to include values within a range around such specifically stated value that produce substantially the same effect as the specifically stated value. As used herein, except to the extent expressly and specifically stated otherwise, the term "approximately" is intended to mean within ±10% of the stated value.

In the preceding discussion, the terms "operators", "operations", "functions" and similar terms refer to method or process steps or to hardware components, depending upon the particular implementation/embodiment.

In the event of any conflict or inconsistency between the disclosure explicitly set forth herein or in the accompanying drawings, on the one hand, and any materials incorporated by reference herein (whether explicitly or by operation of any applicable law, regulation or rule), on the other, the present disclosure shall take precedence. In the event of any conflict or inconsistency between the disclosures of any applications or patents incorporated by reference herein, the disclosure most recently added or changed shall take precedence.

For purposes of the present disclosure, any explicit or implicit reference to any data items being included within the same database record means that such data items are linked together or logically associated with each other. Also, except to the extent clearly and expressly indicated to the contrary, references herein and/or in the accompanying drawings to information being included within a database, or within different databases, are not to be taken as limiting; rather, such references typically are intended to simplify and/or more clearly illustrate the subject discussion, and in alternate embodiments any or all of the referenced information can be distributed across any number of database structures, as is well-understood in the art.

Unless clearly indicated to the contrary, words such as "optimal", "optimize", "maximize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing or manufacturing constraints.

In the above discussion, certain methods are explained by breaking them down into steps listed in a particular order. Similarly, certain processing is performed by showing and/or describing modules arranged in a certain order. However, it should be noted that in each such case, except to the extent clearly indicated to the contrary or mandated by practical considerations (such as where the results from one step are necessary to perform another), the indicated order is not critical but, instead, that the described steps and/or modules can be reordered and/or two or more of such steps (or the processing within two or more of such modules) can be performed concurrently.

References herein to a "criterion", "multiple criteria", "condition", "conditions" or similar words which are intended to trigger, limit, filter or otherwise affect processing steps, other actions, the subjects of processing steps or actions, or any other activity or data, are intended to mean "one or more", irrespective of whether the singular or the plural form has been used. For instance, any criterion or condition can include any combination (e.g., Boolean combination) of actions, events and/or occurrences (i.e., a multipart criterion or condition).

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

As used herein, the words "include", "includes", "including", and all other forms of the word should not be understood as limiting, but rather any specific items following such words should be understood as being merely exemplary.

Several different embodiments of the present invention are described above and/or in any documents incorporated by reference herein, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the intent and the scope of the invention. Accordingly, the invention is not limited to the precise embodiments shown in the drawings and described above. Rather, it is intended that all such variations not departing from the intent of the invention are to be considered as within the scope thereof, as limited solely by the claims appended hereto.

What is claimed is:

1. A system for verifying memory-read capabilities of a memory device before initiating normal data-read operations, comprising:
    wherein the memory device includes a memory cell array having a set of read-only verification information; and
    a memory-read controller, coupled to the memory device, comprising a processor that is coupled to a memory area storing executable process steps and configured to retrieve and execute said stored process steps,
    wherein the verification information includes a plurality of read-only first bit values in a first row of the memory cell array and a plurality of read-only second bit values in a second row of the memory cell array,
    wherein each of the second bit values, on a same bit line as a corresponding one of the first bit values, has an inverse value as the corresponding one of the first bit values, and
    wherein the stored process steps include steps to:
    (a) read the set of read-only verification information from the memory device; and
    (b) determine, by a comparison to a pre-stored bit string, whether the read-only first bit values and the read-only second bit values are correct;
    wherein any normal data-write operations to the memory device occur after the comparison indicating that the read-only first bit values and the read-only second bit values are correct is complete; and
    wherein the verification information also includes an error correction code (ECC), and
    wherein the process steps include a step of checking the verification information read in step (a) for an un-correctable ECC error.

2. The system according to claim 1,
    wherein the memory-read controller automatically begins executing the stored process steps upon power up; and
    wherein if the determine by the comparison is correct, then the memory-read controller outputs a signal that a supplied power to the memory device is high enough to reliably read data from the memory device.

3. The system according to claim 1,
    wherein the first row and the second row of the memory cell array are immediately adjacent to each other.

4. The system according to claim 1,
    wherein there are at least six of the second bit values and at least six of the corresponding ones of the first bit values.

5. The system according to claim 1,
    wherein there are at least eight of the second bit values and at least eight of the corresponding ones of the first bit values.

6. The system according to claim 1:
    wherein step (b) is performed only if it is determined that there is no said un-correctable ECC error.

7. The system according to claim 1,
    wherein each cell in the memory cell array representing one of the first bit values or one of the second bit values, referred to as a subject bit value, is encoded using differential-redundant encoding across 4 one-bit subcells, with 2 of said one-bit subcells encoded with the subject bit value and with 2 of said one-bit subcells encoded with the inverse of the subject bit value.

8. The system according to claim 1,
    wherein the memory device is a one-time programmable (OTP) non-volatile memory device.

9. The system according to claim 1,
    wherein the stored process steps also include a step:
    (c) in response to an affirmative determination in step (b), to initiate the normal data-read operations.

10. The system according to claim 9,
    wherein the stored process steps also include a step to repeat steps (a) and (b), and
    wherein the normal data-read operations begin in step (c) only if an affirmative determination is made in step (b) a predetermined number of times, said predetermined number being at least 2.

11. The system according to claim 10,
    wherein the predetermined number is at least 4.

12. The system according to claim 11,
wherein the predetermined number of affirmative determinations must be consecutive for the normal data-read operations to begin in step (c).

13. The system according to claim 10,
wherein the stored process steps also include a step, executed between repetitions of said steps (a) and (b), to wait a specified period of time, the specified period of time being at least 50 microseconds (μs).

14. The system according to claim 13,
wherein the specified period of time is at least 80 μs.

15. The system according to claim 10,
wherein the verification information also includes an error correction code (ECC),
wherein the process steps include a step of checking the verification information read in step (a) for an un-correctable ECC error prior to each iteration of step (b), and
wherein said iteration of step (b) is performed only if it is determined that there is no said un-correctable ECC error.

16. The system according to claim 15,
wherein in the event of either an un-correctable ECC error or a negative determination in step (b), a pass counter is reset and a try counter is incremented.

17. The system according to claim 16,
wherein when the try counter exceeds a specified threshold, a fail indication is output.

18. The system according to claim 16,
wherein in response to the pass counter exceeding a specified threshold, the normal data-read operations are initiated.

19. A system for verifying memory-read capabilities of a memory device before initiating normal data-read operations from the memory device, comprising:
wherein the memory device includes a one-time programmable (OTP) non-volatile memory cell array having a set of previously stored verification information;
wherein the previously stored verification information includes a plurality of first bit values in a first row of the memory cell array and a plurality of second bit values in a second row of the memory cell array,
wherein each of the second bit values, on a same bit line as a corresponding one of the first bit values, has an inverse value as the corresponding one of the first bit values;
wherein the system includes a memory-read controller, coupled to the memory device, and configured to,
read and compare the first bit values and the second bit values to a pre-stored bit string;
verify that the memory device is ready for normal data-read operations if the comparison of the first bit values and the second bit values to the pre-stored bit string is correct; and
delay normal data-write operations to the memory device until after the verification indicates that the comparison of the first bit values and the second bit values to the pre-stored bit string is correct;
wherein the verification information also includes an error correction code (ECC); and
check the verification information read for an un-correctable ECC error.

20. A system for verifying memory-read capabilities of a memory device before initiating normal data-read operations, comprising:
wherein the memory device includes a memory cell array having a set of read-only verification information; and
a memory-read controller, coupled to the memory device, comprising a processor that is coupled to a memory area storing executable process steps and configured to retrieve and execute said stored process steps,
wherein the verification information includes a plurality of read-only first bit values in a first row of the memory cell array and a plurality of read-only second bit values in a second row of the memory cell array,
wherein each of the second bit values, on a same bit line as a corresponding one of the first bit values, has an inverse value as the corresponding one of the first bit values, and
wherein the stored process steps include steps to:
(a) read the set of read-only verification information from the memory device; and
(b) determine, by a comparison to a pre-stored bit string, whether the read-only first bit values and the read-only second bit values are correct;
wherein any normal data-write operations to the memory device occur after the comparison indicating that the read-only first bit values and the read-only second bit values are correct is complete;
(c) in response to an affirmative determination in step (b), to initiate the normal data-read operations;
wherein the stored process steps also include a step to repeat steps (a) and (b), and
wherein the normal data-read operations begin in step (c) only if an affirmative determination is made in step (b) a predetermined number of times, said predetermined number being at least 2.

* * * * *